United States Patent
Lin et al.

(10) Patent No.: US 10,685,716 B1
(45) Date of Patent: Jun. 16, 2020

(54) METHOD OF FAST ERASING LOW-CURRENT EEPROM ARRAY

(71) Applicant: YIELD MICROELECTRONICS CORP., Chu-Pei (TW)

(72) Inventors: Hsin-Chang Lin, Chu-Pei (TW);
Cheng-Yu Chung, Chu-Pei (TW);
Wen-Chien Huang, Chu-Pei (TW)

(73) Assignee: YIELD MICROELECTRONICS CORP., Chu-Pei, Hsinchu County (TW)

( * ) Notice: Subject to any disclaimer, the term of this patent is extended or adjusted under 35 U.S.C. 154(b) by 0 days.

(21) Appl. No.: 16/381,324

(22) Filed: Apr. 11, 2019

(51) Int. Cl.
| | |
|---|---|
| *G11C 16/04* | (2006.01) |
| *G11C 16/16* | (2006.01) |
| *H03K 19/094* | (2006.01) |
| *G11C 16/08* | (2006.01) |
| *H01L 27/115* | (2017.01) |
| *G11C 16/34* | (2006.01) |
| *G11C 16/14* | (2006.01) |

(52) U.S. Cl.
CPC .......... *G11C 16/16* (2013.01); *G11C 16/0483* (2013.01); *G11C 16/08* (2013.01); *G11C 16/14* (2013.01); *G11C 16/344* (2013.01); *H01L 27/115* (2013.01); *H03K 19/094* (2013.01)

(58) Field of Classification Search
CPC ......... G11C 16/16; G11C 16/08; G11C 16/14; G11C 16/344; G11C 16/0483; H01L 27/115
See application file for complete search history.

(56) References Cited

U.S. PATENT DOCUMENTS

| | | | | |
|---|---|---|---|---|
| 5,963,478 A | * | 10/1999 | Sedlak | G11C 16/0433 365/185.11 |
| 8,050,091 B2 | * | 11/2011 | Park | H01L 27/115 365/185.05 |
| 9,318,208 B1 | * | 4/2016 | Lin | G11C 16/10 |
| 9,331,150 B2 | * | 5/2016 | Suzuki | H01L 29/0619 |

* cited by examiner

*Primary Examiner* — Pho M Luu
(74) *Attorney, Agent, or Firm* — Rosenberg, Klein & Lee

(57) ABSTRACT

A method of fast erasing a low-current EEPROM array. The EEPROM array comprises bit line groups, word lines, common source lines, and sub-memory arrays. Each sub-memory array includes a first memory cell and a second memory cell. The first memory cell is connected with one bit line of a first bit line group, a first common source line, and a first word line. The second memory cell is connected with the other bit line of the first bit line group, the first common source line, and a second word line. The first and second memory cells are operation memory cells and symmetrically arranged at two sides of the first common source line. The source or the drain is floated during erasing to perform the fast bytes-erasing with low current, low voltage and low cost.

14 Claims, 6 Drawing Sheets

US 10,685,716 B1

METHOD OF FAST ERASING LOW-CURRENT EEPROM ARRAY

BACKGROUND OF THE INVENTION

Field of the Invention

The present invention relates to a memory array, particularly to a method of fast erasing a low-current EEPROM (Electrically Erasable Programmable Read Only Memory) array.

Description of the Related Art

The CMOS (Complementary Metal Oxide Semiconductor) technology has been a normal process for fabricating ASIC (Application Specific Integrated Circuit). Flash memories and EEPROM (Electrically Erasable Programmable Memory) have been widely used in electronic products because their data will not volatilize but can be erased and programmed electrically.

Non-volatile memories are programmable, storing charges to vary gate voltages of transistors, or not storing charges to preserve the original gate voltages of transistors. In erasing a non-volatile memory, the charges stored in the non-volatile memory are eliminated to resume the initial state of the memory. The flash memory architecture has advantages of small size and low cost. However, the flash memory architecture does not allow erasing or programming a single one-bit memory cell but allows erasing or programming a block of the memory. Therefore, the flash memory architecture is inconvenient in application. The EEPROM architecture supports a "byte write" function. Thus, the EEPROM architecture is more convenient than the flash memory architecture. Refer to FIG. 1 and FIG. 2 respectively schematically showing a circuit and a sectional view of a one-bit memory cell of the conventional EEPROM architecture. As shown in FIG. 1 and FIG. 2, the one-bit memory cell of the EEPROM architecture is a polysilicon memory cell and comprises a memory transistor 10, a selection transistor 12 and a capacitor structure disposed above the memory transistor 10. Because of the abovementioned memory cell structure, EEPROM occupies larger area than the flash memory. Besides, in bit erasing of EEPROM, the transistors at the unselected positions must be separated. Thus, the cost of using EEPROM is increased.

In order to overcome the abovementioned problems of the conventional technology, a low-current EEPROM array is developed and an operation method thereof with low-current, low-voltage and low-cost is proposed to perform the rapid bytes-erasing operation accordingly.

SUMMARY OF THE INVENTION

The primary objective of the present invention is to provide a method of fast erasing a low-current EEPROM (Electrically Erasable Programmable Read Only Memory) array with low-current, low-voltage and low-cost. A special bias voltage is used to achieve the rapid bytes-erasing operation.

In order to achieve the abovementioned objective, the present invention proposes a method of fast erasing a low-current EEPROM array, which is applied to a low-current EEPROM array. The low-current EEPROM array comprises a plurality of parallel bit lines, a plurality of parallel word lines; a plurality of parallel common source lines; and a plurality of sub-memory arrays. The bit lines are divided into a plurality of bit line groups, including a first bit line group. The bit lines are vertical to the word lines. The word lines include a first word line and a second word line and are parallel to the common source lines. The common source lines include a first common source line. Each of the sub-memory arrays is connected with a bit line group, a pair of word lines and a common source line. Each sub-memory array contains a first memory cell and a second memory cell. The first memory cell is connected with the first bit line group, the first common source line and the first word line. The second memory cell is connected with the first bit line group, the first common source line and the second word line. The first memory cell and the second memory cell are symmetrically arranged at two sides of the first common source line. The first bit line group includes two bit lines, which are respectively connected with the first memory cell and the second memory cell.

Each of the first and second memory cells functions as an operation memory cell. In selecting one of the operation memory cells as a selected memory cell in carrying out its operations, the operation memory cells, that are connected to the same bit line connecting to the selected memory cell, but not connected to the same common source line connecting to the selected memory cell, are referred to as a plurality of common bit line memory cells; the operation memory cells, that are connected to the same word line connecting to the selected memory cell, are referred to as a plurality of common word memory cells; and the rest of the operation memory cells are referred to a plurality of unselected memory cells.

The first and second memory cells may both contain an N-type field effect transistor located in a P-type well region or in a P-type substrate. Or, alternatively, they may both contain a P-type field effect transistor located in an N-type well region or in an N-type substrate.

In case that the memory utilized contains an N-type field effect transistor, when in operations, performing the following voltage applications as required: applying a substrate voltage $V_{subp}$ respectively on a P-type well region or a P-type substrate connecting to a selected memory cell; applying a first bit voltage $V_{b1}$, a first word voltage $V_{w1}$, a first common source voltage $V_{s1}$ respectively on a bit line, a word line, and a common source line, all three connecting to each selected memory cell; applying second word voltage $V_{w2}$, a second common source voltage $V_{s2}$ respectively on a word line and a common source line connecting to each common bit memory cell; applying a second bit voltage $V_{b2}$, a first common source voltage $V_{s1}$ respectively on a bit line and common source line connecting to each common word memory cell (each of the common word memory cells sharing a common source line); and applying a second bit voltage $V_{b2}$, a second word voltage $V_{w2}$, and a second common source voltage $V_{s2}$ respectively on the bit line, the word line, and the common source line connecting to each unselected memory cell.

As such, in erasing data from the selected memory cell, following conditions are to be satisfied: $V_{subp}$ is grounded (0), $V_{b1}$=HV (High Voltage), $V_{s1}$=floating voltage, and $V_{w1}$=0 to LV (Low Voltage); or $V_{subp}$ is grounded (0), $V_{b1}$=floating voltage, $V_{s1}$=HV (High Voltage), and $V_{w1}$=0 to LV (Low Voltage).

In case that the memory utilized contains a P-type field effect transistor, when in operations, performing the following voltage applications as required: applying a substrate voltage $V_{subn}$ on an N-type well region or an N-type substrate connecting to a selected memory cell. As such, in case that the memory utilized contains a P-type field effect transistor, such that in erasing data from the selected memory cell, following conditions are to be satisfied: $V_{subn}$=HV (High Voltage), $V_{b1}$ is grounded (0), $V_{s1}$=floating voltage, and $V_{w1}$=HV (High Voltage) to MV (medium voltage); or $V_{subn}$=HV (High Voltage), $V_{b1}$=floating voltage, $V_{s1}$=is grounded (0), and $V_{w1}$=HV (High Voltage) to MV (medium voltage).

Below, embodiments are described in detail in cooperation with the attached drawings to make easily understood the objectives, technical contents, characteristics and accomplishments of the present invention.

DETAILED DESCRIPTION OF THE INVENTION

Figure 1:
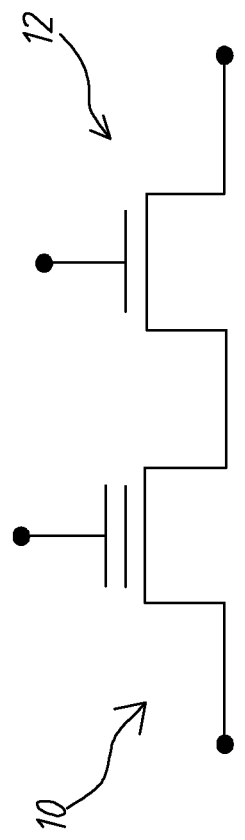
FIG. 1 schematically shows the circuit of a one-bit memory cell of a conventional EEPROM architecture.
Figure 2:
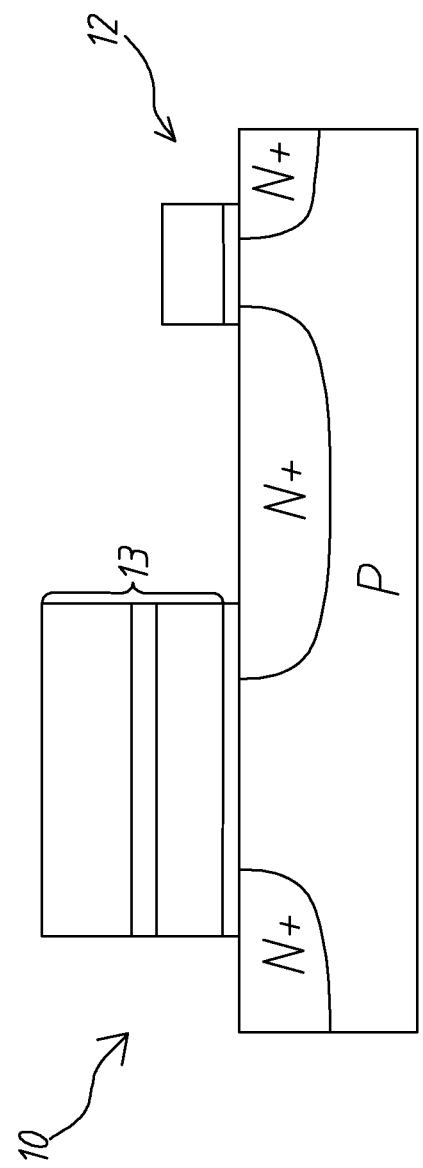
FIG. 2 schematically shows a sectional view of a one-bit memory cell of a conventional EEPROM architecture.
Figure 3:
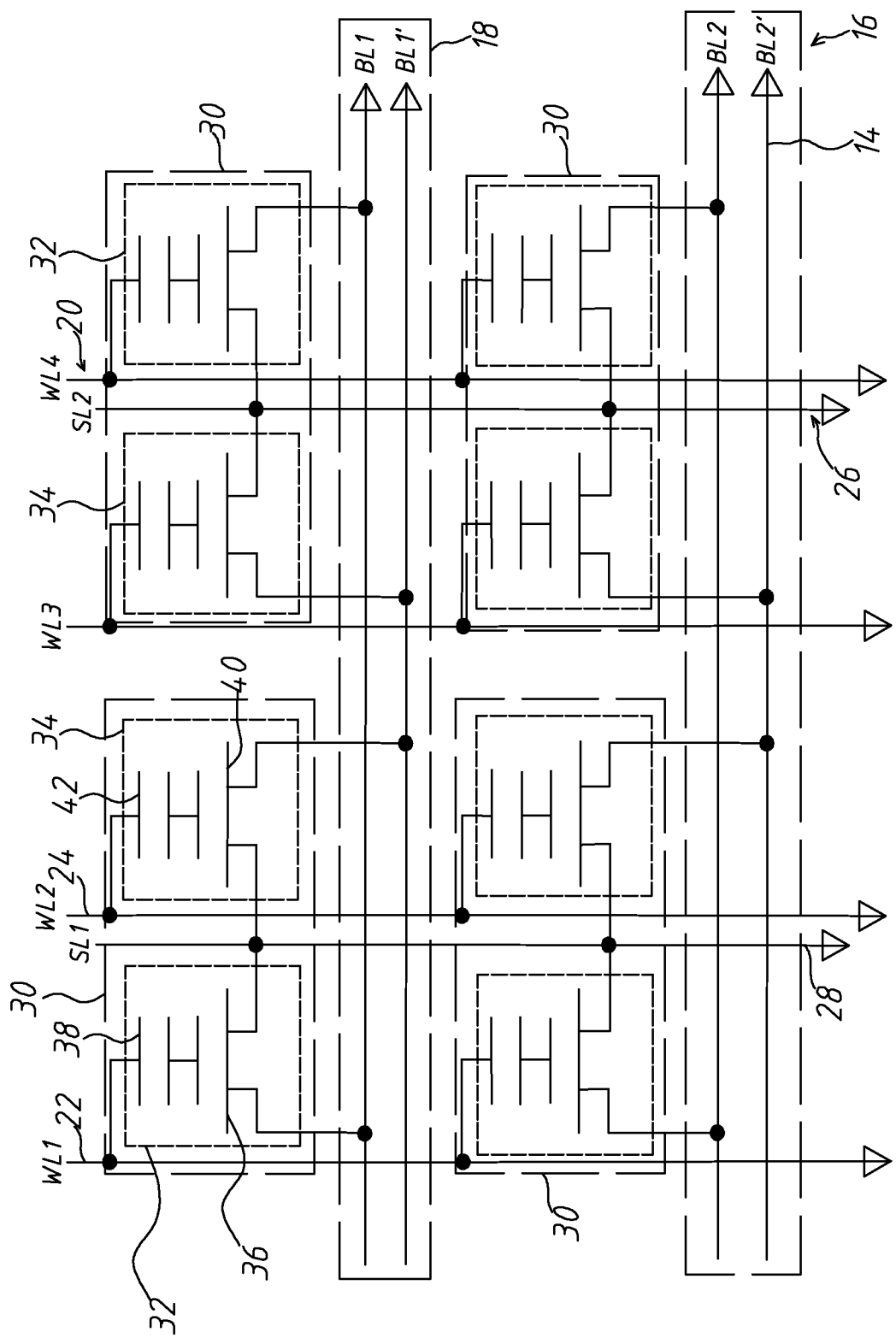
FIG. 3 schematically shows the circuit of a low-current EEPROM array according to an embodiment of the present invention.
Figure 4:
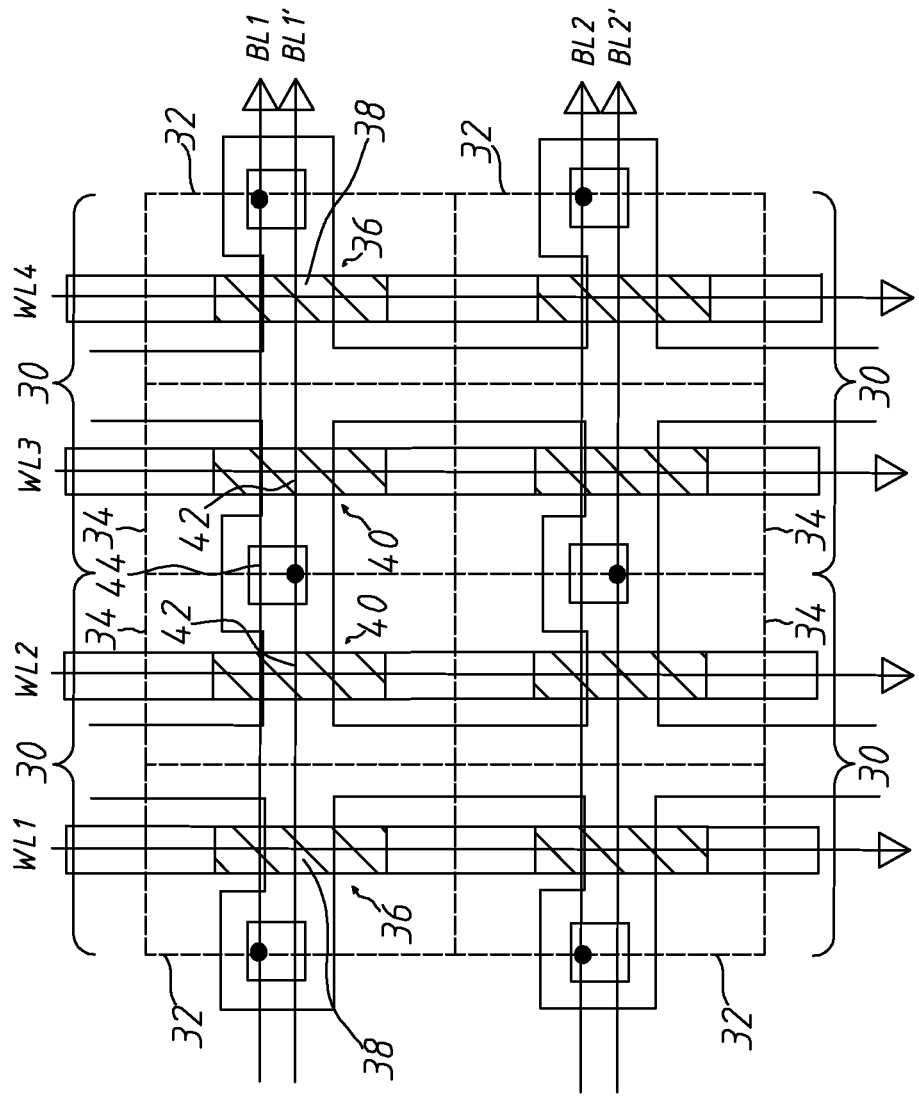
FIG. 4 schematically shows the layout of the circuit of a low-current EEPROM array according to the embodiment of the present invention.

Refer to FIG. 3 and FIG. 4 for a first embodiment of the present invention. The method for fast erasing a low-current EEPROM array is applied to a low-current EEPROM array. The low-current EEPROM array comprises a plurality of parallel bit lines 14; a plurality of parallel word lines 20; a plurality of parallel common source lines 26; and a plurality of sub-memory arrays 30. The bit lines 14 are divided into a plurality of bit line groups 16, including a first bit line group 18. The first bit line group 18 includes two bit lines 14. The word lines 20 are vertical to the bit lines 14 and include a first word line 22 and a second word line 24. The common source lines 26 are parallel to the word lines 20 and include a first common source line 28. The bit lines 14, the word lines 20 and the common source lines 26 are connected with sub-memory arrays 30 each containing 2×1 pieces of memory cells. Each sub-memory array 30 is connected with one bit line group 16, two word lines 20 and one common source line 26. The connections of the sub-memory arrays 30 with the bit lines 14, the word lines 20 and the common source lines 26 are similar. The common characteristics of the connections are described below.

Figure 5:
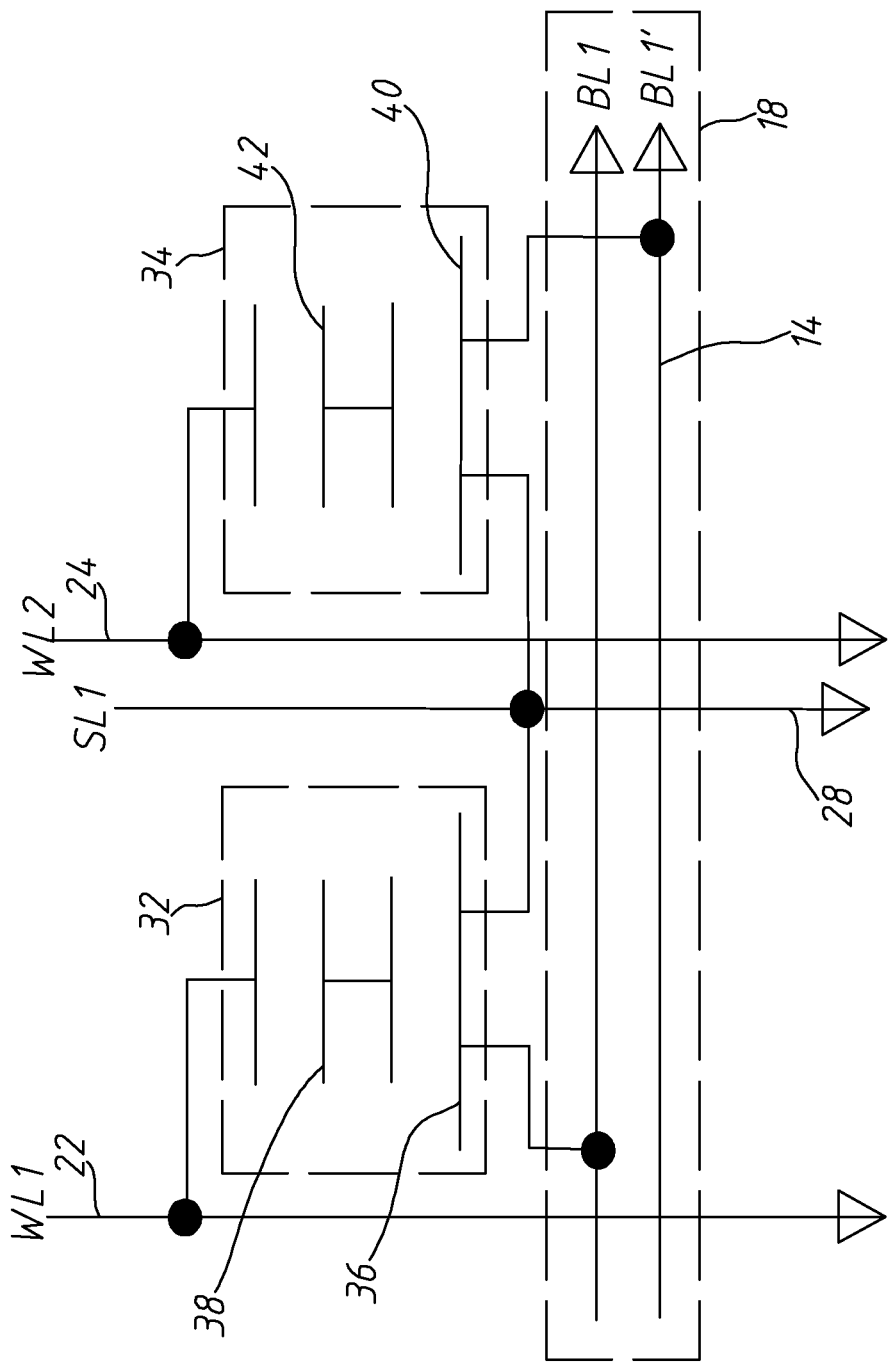
FIG. 5 schematically shows the circuit of a sub-memory array of a low-current EEPROM array according to the embodiment of the present invention.

Refer to FIG. 4 and FIG. 5. Each sub-memory array 30 includes a first memory cell 32 and a second memory cell 34. The first memory cell 32 is connected with one bit line 14 of the first bit line group 18, the first common source line 28 and the first word line 22. The second memory cell 34 is connected with the other bit line 14 of the first bit line group 18, the first common source line 28 and the second word line 24. The first memory cell 32 and the second memory cell 34 are symmetrically arranged at two sides of the first common source line 28. In the embodiment, two second memory cells 34 of two adjacent sub-memory arrays 30 are neighboring and share a common bit line 14 and a common contact. In other words, the FETs 40 of two second memory cells 34 are neighboring and share a common bit line 14 and a common drain contact 44. Thereby, the area of the overall layout is reduced.

The first memory cell 32 further includes an FET 36 (Field Effect Transistor) and a capacitor 38. The FET 36 has a floating gate, a drain connected with the bit line 14 of the first bit line group 18, and a source connected with the first common source line 28. One terminal of the capacitor 38 is connected with the floating gate of the FET 36, and the other terminal of the capacitor 38 is connected with the first word line 22 to receive a bias from the first word line 22. The FET 36 receives a bias from the bit line 14 of the first bit line group 18 and receives a bias from the first common source line 28 so as to write data into or erase data from the floating gate of the FET 36.

The second memory cell 34 further includes an FET 40 and a capacitor 42. The FET 40 has a floating gate, a drain connected with the bit line 14 of the first bit line group 18, and a source connected with the first common source line 28. One terminal of the capacitor 42 is connected with the floating gate of the FET 40, and the other terminal of of the capacitor 42 is connected with the second word line 24 to receive a bias $V_w$ from the second word line 24. The FET 40 receives a bias from the bit line 14 of the first bit line group 18 and receives a bias from the first common source line 28 so as to write data into or erase data from the floating gate of the FET 40. In two adjacent sub-memory arrays 30, the FETs 40 of two second memory cells 34 are neighboring and share a common bit line 14 and a common drain contact 44, whereby the area of the overall layout of the circuit is reduced.

Refer to FIG. 3 again. Both the FET 36 and the FET 40 are N-type FETs built in a P-type substrate or a P-type well region. Alternatively, both the FET 36 and the FET 40 are P-type FETs built in an N-type substrate or an N-type well region. The method for operating a low-current EEPROM array has different sub-embodiments with respect to the types of FETs. Below, the sub-embodiment corresponding to the N-type FETs 36 and 40 is described firstly. In order to understand the ways of operations, the names of various memory cells are first clearly defined as follows.

Both the abovementioned first and second memory cells 32 and 34 are operation memory cells, and one of the operation memory cells can be chosen as the selected memory cell to proceed with the operations as required. As to the operation memory cells, that are connected to the same bit line 14 connecting to the selected memory cell, but not connected to the same common source line 26 connecting to the selected memory cell, are referred to as a plurality of common bit memory cells; the operation memory cells, that are connected to the same word line 20 connecting to the selected memory cell, are referred to as a plurality of common word memory cells; and the rest of the operation memory cells are referred to as a plurality of unselected memory cells.

In the following, the operations of the embodiment are described, such that in this way of operation, other unselected memory cells will not be affected, thus operation is related to a specific single memory cell.

When in operations, performing the following voltage applications as required: applying a substrate voltage $V_{subp}$ on a P-type well region or P-type substrate connecting to a selected memory cell; applying a first bit voltage $V_{b1}$, a first word voltage $V_{w1}$, a first common source voltage $V_{s1}$ on a bit line 14, a word line 20, and a common source line 26, all connecting to a selected memory cell; applying second word voltage $V_{w2}$, a second common source voltage $V_{s2}$ respectively on a word line 20 and a common source line 26, both connecting to each common bit memory cell; applying a second bit voltage $V_{b2}$, a first common source voltage $V_{s1}$ on a bit line 14, and a common source line 26, both connecting to each common word memory cell (each of the common word memory cells sharing a common source line); and applying a second bit voltage $V_{b2}$, a second word voltage $V_{w2}$, and a second common source voltage $V_{s2}$ on the bit line 14, the word line 20, and the common source line 26, all connecting to an unselected memory cell.

In erasing data from the selected memory cell, the following conditions have to be satisfied:

$V_{subp}$ is grounded (0), $V_{b1}$=HV (High Voltage),
  $V_{s1}$=floating voltage, and $V_{w1}$=0 to LV (Low Voltage); or $V_{subp}$ is grounded (0), $V_{b1}$=floating voltage, $V_{s1}$=HV (High Voltage), and $V_{w1}$=0 to LV (Low Voltage).

While the FET 36 and the FET 40 are P-type FETs, applying a substrate voltage $V_{subn}$ on an N-type well region or an N-type substrate connecting to a selected memory cell.

In erasing data from the selected memory cell, following conditions are to be satisfied:

$V_{subn}$=HV (High Voltage), $V_{b1}$ is grounded (0),
  $V_{s1}$=floating voltage, and $V_{w1}$=HV (High Voltage) to MV (medium voltage); or $V_{subn}$=HV (High Voltage), $V_{b1}$=floating voltage,
  $V_{s1}$=is grounded (0), and $V_{w1}$=HV (High Voltage) to MV (medium voltage).

Since two memory cells 32 and 34 in a sub-memory array 30 are connected respectively to two bit lines 14, therefore, the first word line 22 and the second word line 24 in the same sub-memory array 30 can be connected to the same voltage, without affecting the bite-writing and bite-erasing functions of the EEPROM of the present invention, namely, it may be connected to outside through a same connection line, hereby reducing the area for the decoding region.

Figure 6:
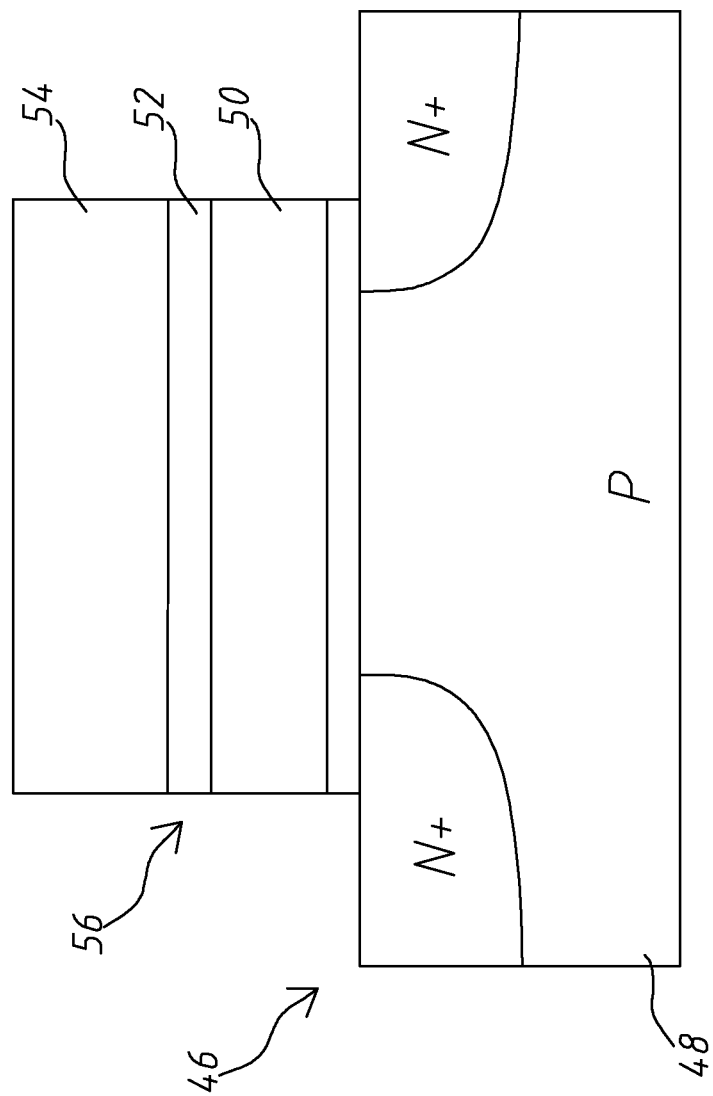
FIG. 6 schematically shows a sectional view of an N-type FET and a capacitor of a memory cell according to one embodiment of the present invention.

In the following, a cross section view of a structure of field effect transistors 36 and 40 and capacitors 38 and 42 of the present invention is described. In this case, an N-type field effect transistor is taken as an example for explanation. As shown in FIG. 6, an N-type field effect transistor 46 is disposed in a P-type semiconductor substrate 48, and is provided with a floating gate 50. On the floating gate 50 is provided sequentially with an oxide layer 52 and a control gate 54, such that the control gate 54, the oxide layer 52, and the floating gate 50 form a capacitor 56, and the floating gate 50 and the control gate 54 are made of poly-silicon. In case that a P-type semiconductor substrate is utilized, then a P-type well region can be provided in the substrate, such that an N-type field effect transistor 46 is disposed in the P-type well region. In such a structure design of memory cell, namely, the structure of Flash memory, the area and cost required for the non-volatile memory array can be reduced significantly.

Figure 7:
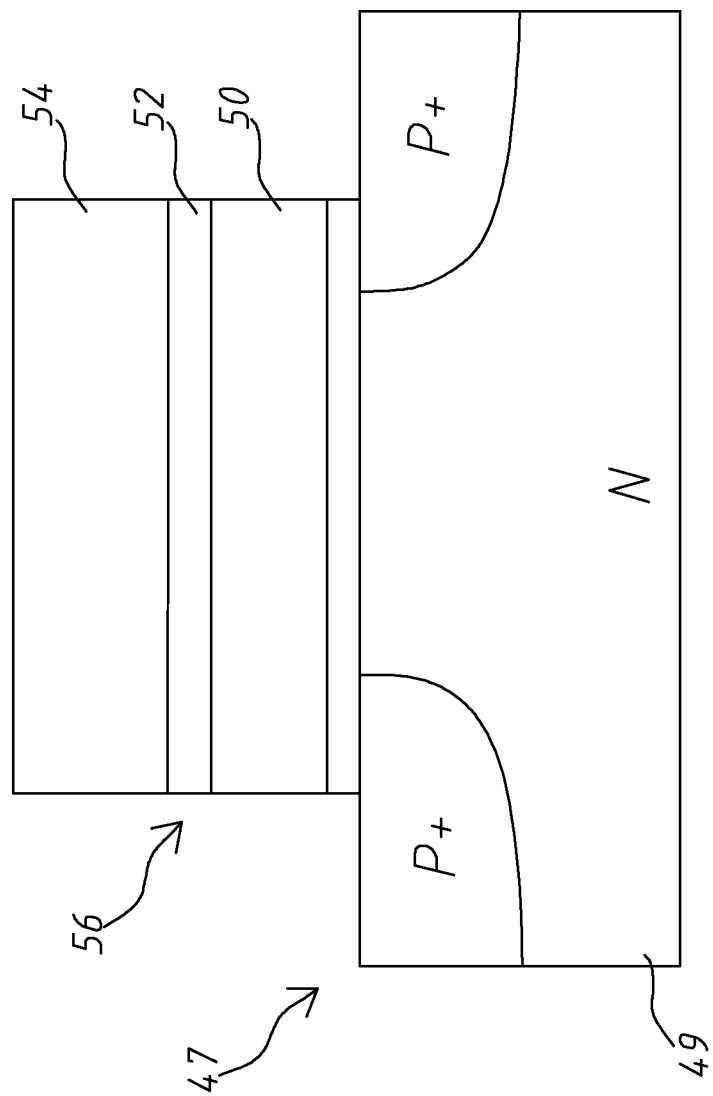
FIG. 7 schematically shows a sectional view of a P-type FET and a capacitor of a memory cell according to one embodiment of the present invention.

Similarly, in the following, a cross section view of a structure of field effect transistors 36 and 40 and capacitors 38 and 42 of the present invention is described. In this case, a P-type field effect transistor is taken as an example for explanation. As shown in FIG. 7, a P-type field effect transistor 47 is disposed in an N-type semiconductor substrate 49, and is provided with a floating gate 50. On the floating gate 50 is provided sequentially with an oxide layer 52 and a control gate 54, such that the control gate 54, the oxide layer 52, and the floating gate 50 form a capacitor 56, and the floating gate 50 and the control gate 54 are made of poly-silicon. In case that an P-type semiconductor substrate is utilized, then an N-type well region can be provided in the substrate, such that a P-type field effect transistor 47 is disposed in an N-type well region.

Summing up the above, the method of fast erasing a low-current EEPROM array according to the present invention is applied to a low-current EEPROM array. For such Flash memory architecture of smaller area at lower cost, the present invention particularly proposes that the source or the drain is floated during erasing. Therefore, the byte-erasing operation of the memory cell is simpler and faster.

The present invention has been demonstrated in detail with the abovementioned embodiments. However, it should be noted: these embodiments are only to exemplify the present invention but not to limit the scope of the present invention. Any equivalent modification or variation according to the shapes, structures, characteristics and principles disclosed in the specification is to be also included within the scope of the present invention.

What is claimed is:

1. A method for fast erasing a low-current electrically erasable programmable read only memory array, wherein said low-current electrically erasable programmable read only memory (EEPROM) array comprises a plurality of parallel bit lines; a plurality of parallel word lines; a plurality of parallel common source lines; and a plurality of sub-memory arrays, and wherein said bit lines are divided into a plurality of bit line groups including a first bit line group, and wherein said word lines are vertical to said bit lines and include a first word line and a second word line, and wherein said common source lines are parallel to said word lines and include a first common source line, and wherein each said sub-memory array is connected with one said bit line group, two said word lines and one said common source line, and wherein each said sub-memory array includes a first memory cell and a second memory cell, and wherein said first memory cell is connected with said first bit line group, said first common source line and said first word line, and wherein said second memory cell is connected with said first bit line group, said first common source line and said second word line, and wherein said first memory cell and said second memory cell are symmetrically arranged at two sides of said first common source line, and wherein said first bit line group includes two said bit lines, which are respectively connected with said first memory cell and said second memory cell, and wherein each of said first memory cell and said second memory cell has an N-type field-effect transistor (FET) built in a P-type substrate or a P-type well region, and wherein said first memory cell and said second memory cell are both operation memory cells, in selecting one of said operation memory cells as a selected memory cell in carrying out operations, said operation memory cells, that are connected to said same bit line connecting to said selected memory cell, but not connected to said same common source line connecting to said selected memory cell, are referred to as a plurality of common bit memory cells; and said operation memory cells, that are connected to said same word line connecting to said selected memory cell, are referred to as a plurality of common word memory cells; and rest of said operation memory cells are referred to a plurality of unselected memory cells, said method includes following steps of:

applying a substrate voltage $V_{subp}$ on said P-type substrate or said P-type well region connecting to said selected memory cell; applying a first bit voltage $V_{b1}$, a first word voltage $V_{w1}$, a first common source voltage $V_{s1}$ respectively on said bit line, said word line, and said common source line, all connecting to said selected memory cell; applying a second word voltage $V_{w2}$, a second common source voltage $V_{s2}$ respectively on said word line and said common source line, both connecting to each said common bit memory cell; applying a second bit voltage $V_{b2}$, said first common source voltage $V_{s1}$ respectively on said bit line and said common source line, both connecting to each said common word memory cell; and applying said second bit voltage $V_{b2}$, said second word voltage $V_{w2}$, and said second common source voltage $V_{s2}$ respectively on said bit line, said word line, and said common source line, all connecting to each said unselected memory cell;

wherein when erasing data from said selected memory cell, following conditions are satisfied:

$V_{subp}$ is grounded (0), $V_{b1}$=HV (High Voltage), $V_{s1}$=floating voltage, and $V_{w1}$=0 to LV (Low Voltage); or $V_{subp}$ is grounded (0), $V_{b1}$=floating voltage, $V_{s1}$=HV (High Voltage), and $V_{w1}$=0 to LV (Low Voltage).

2. The method for fast erasing a low-current electrically erasable programmable read only memory array according to claim 1, wherein said first word line and said second word line in said same sub-memory array are connected with an identical said word voltage.

3. The method for fast erasing a low-current electrically erasable programmable read only memory array according to claim 1, wherein two said second memory cells of two adjacent said sub-memory arrays are neighboring and share one common said bit line and a common contact.

4. The method for fast erasing a low-current electrically erasable programmable read only memory array according to claim 1, wherein said N-type FET of said first memory cell has a floating gate, a drain connected with said first bit line group, and a source connected with said first common source, and wherein said first memory cell also has a capacitor, and wherein one terminal of said capacitor is connected with said floating gate, and wherein another terminal of said capacitor is connected with said first word line to receive a bias from said first word line, and wherein said N-type FET receives a bias from said first bit line group and receives a bias from said first common source line to write data into or erase data from said floating gate of said N-type FET.

5. The method for fast erasing a low-current electrically erasable programmable read only memory array according to claim 4, wherein an oxide layer and a control gate are formed above said floating gate in sequence, and wherein said control gate, said oxide layer and said floating gate jointly form said capacitor, and wherein said floating gate and said control gate are made of polysilicon.

6. The method for fast erasing a low-current electrically erasable programmable read only memory array according to claim 1, wherein said N-type FET of said second memory cell has a floating gate, a drain connected with said first bit line group, and a source connected with said first common source, and wherein said second memory cell also has a capacitor, and wherein one terminal of said capacitor is connected with said floating gate, and wherein another terminal of said capacitor is connected with said second word line to receive a bias from said second word line, and wherein said N-type FET receives a bias from said first bit line group and receives a bias from said first common source line to write data into or erase data from said floating gate of said N-type FET.

7. The method for fast erasing a low-current electrically erasable programmable read only memory array according to claim 6, wherein an oxide layer and a control gate are formed above said floating gate in sequence, and wherein said control gate, said oxide layer and said floating gate jointly form said capacitor, and wherein said floating gate and said control gate are made of polysilicon.

8. A method for fast erasing a low-current electrically erasable programmable read only memory array, wherein said low-current electrically erasable programmable read only memory (EEPROM) array comprises a plurality of parallel bit lines; a plurality of parallel word lines; a plurality of parallel common source lines; and a plurality of sub-memory arrays, and wherein said bit lines are divided into a plurality of bit line groups including a first bit line group, and wherein said word lines are vertical to said bit lines and include a first word line and a second word line, and wherein said common source lines are parallel to said word lines and include a first common source line, and wherein each said sub-memory array is connected with one said bit line group, two said word lines and one said common source line, and wherein each said sub-memory array includes a first memory cell and a second memory cell, and wherein said first memory cell is connected with said first bit line group, said first common source line and said first word line, and wherein said second memory cell is connected with said first bit line group, said first common source line and said second word line, and wherein said first memory cell and said second memory cell are symmetrically arranged at two sides of said first common source line, and wherein said first bit line group includes two said bit lines, which are respectively connected with said first memory cell and said second memory cell, and wherein each of said first memory cell and said second memory cell has an P-type field-effect transistor (FET) built in a N-type substrate or a N-type well region, and wherein said first memory cell and said second memory cell are both operation memory cells, in selecting one of said operation memory cells as a selected memory cell in carrying out operations, said operation memory cells, that are connected to said same bit line connecting to said selected memory cell, but not connected to said same common source line connecting to said selected memory cell, are referred to as a plurality of common bit memory cells; and said operation memory cells, that are connected to said same word line connecting to said selected memory cell, are referred to as a plurality of common word memory cells; and rest of said operation memory cells are referred to a plurality of unselected memory cells, said method includes following steps of:

applying a substrate voltage $V_{subn}$ on said N-type substrate or said N-type well region connecting to said selected memory cell; applying a first bit voltage $V_{b1}$, a first word voltage $V_{w1}$, a first common source voltage $V_{s1}$ respectively on said bit line, said word line, and said common source line, all connecting to said selected memory cell; applying a second word voltage $V_{w2}$, a second common source voltage $V_{s2}$ respectively on said word line and said common source line, both connecting to each said common bit memory cell; applying a second bit voltage $V_{b2}$, said first common source voltage $V_{s1}$ respectively on said bit line and said common source line, both connecting to each said common word memory cell; and applying said second bit voltage $V_{b2}$, said second word voltage $V_{w2}$, and said second common source voltage $V_{s2}$ respectively on said bit line, said word line, and said common source line, all connecting to each said unselected memory cell;

wherein when erasing data from said selected memory cell, following conditions are satisfied:

$V_{subn}$=HV (High Voltage), $V_{b1}$ is grounded (0),
$V_{s1}$=floating voltage, and $V_{w1}$=HV (High Voltage) to MV (medium voltage); or $V_{subn}$=HV (High Voltage), $V_{b1}$=floating voltage,
$V_{s1}$=is grounded (0), and $V_{w1}$=HV (High Voltage) to MV (medium voltage).

9. The method for fast erasing a low-current electrically erasable programmable read only memory array according to claim 8, wherein said first word line and said second word line in said same sub-memory array are connected with an identical said word voltage.

10. The method for fast erasing a low-current electrically erasable programmable read only memory array according to claim 8, wherein two said second memory cells of two adjacent said sub-memory arrays are neighboring and share one common said bit line and a common contact.

11. The method for fast erasing a low-current electrically erasable programmable read only memory array according to claim 8, wherein said P-type FET of said first memory cell has a floating gate, a drain connected with said first bit line group, and a source connected with said first common source, and wherein said first memory cell also has a capacitor, and wherein one terminal of said capacitor is connected with said floating gate, and wherein another terminal of said capacitor is connected with said first word line to receive a bias from said first word line, and wherein said P-type FET receives a bias from said first bit line group and receives a bias from said first common source line to write data into or erase data from said floating gate of said P-type FET.

12. The method for fast erasing a low-current electrically erasable programmable read only memory array according to claim 11, wherein an oxide layer and a control gate are formed above said floating gate in sequence, and wherein said control gate, said oxide layer and said floating gate jointly form said capacitor, and wherein said floating gate and said control gate are made of polysilicon.

13. The method for fast erasing a low-current electrically erasable programmable read only memory array according to claim 8, wherein said P-type FET of said second memory cell has a floating gate, a drain connected with said first bit line group, and a source connected with said first common source, and wherein said second memory cell also has a capacitor, and wherein one terminal of said capacitor is connected with said floating gate, and wherein another terminal of said capacitor is connected with said second word line to receive a bias from said second word line, and wherein said P-type FET receives a bias from said first bit line group and receives a bias from said first common source line to write data into or erase data from said floating gate of said P-type FET.

14. The method for fast erasing a low-current electrically erasable programmable read only memory array according to claim 13, wherein an oxide layer and a control gate are formed above said floating gate in sequence, and wherein said control gate, said oxide layer and said floating gate jointly form said capacitor, and wherein said floating gate and said control gate are made of polysilicon.

\* \* \* \* \*